United States Patent
Sion et al.

(10) Patent No.: US 7,727,591 B2
(45) Date of Patent: Jun. 1, 2010

(54) CONTROLLING OR MODELING A CHEMICAL VAPOR INFILTRATION PROCESS FOR DENSIFYING POROUS SUBSTRATES WITH CARBON

(75) Inventors: Eric Sion, Lingolsheim (FR); Paul-Marie Marquaire, Nancy (FR); René Fournet, Essey les Nancy (FR); Guy-Marie Come, Nancy (FR)

(73) Assignee: Messier-Bugatti, Velizy-Villacoublay (FR)

( * ) Notice: Subject to any disclaimer, the term of this patent is extended or adjusted under 35 U.S.C. 154(b) by 836 days.

(21) Appl. No.: 10/549,444

(22) PCT Filed: Apr. 27, 2004

(86) PCT No.: PCT/FR2004/001009
§ 371 (c)(1),
(2), (4) Date: Jun. 2, 2006

(87) PCT Pub. No.: WO2004/097065
PCT Pub. Date: Nov. 11, 2004

(65) Prior Publication Data
US 2006/0263525 A1 Nov. 23, 2006

(30) Foreign Application Priority Data
Apr. 28, 2003 (FR) .................................. 03 05194

(51) Int. Cl.
*C23C 16/00* (2006.01)
*C23C 16/52* (2006.01)
(52) U.S. Cl. ........................ 427/249.2; 427/8
(58) Field of Classification Search .................. 427/8, 427/248.1, 249.2
See application file for complete search history.

(56) References Cited

U.S. PATENT DOCUMENTS 6,001,419 A * 12/1999 Leluan et al. ............ 427/249.2
6,210,745 B1 * 4/2001 Gaughan et al. ............... 427/8

FOREIGN PATENT DOCUMENTS

WO WO 96/15285 5/1996

OTHER PUBLICATIONS

Glasier et al. Formation of pyrolytic carbon during the pyrolysis of ethane at high conversions. Carbon 39 (2001) 15-23.*

(Continued)

*Primary Examiner*—David Turocy
(74) *Attorney, Agent, or Firm*—Weingarten, Schurgin, Gagnebin & Lebovici LLP

(57) ABSTRACT

A load comprising one or more porous substrates (10) for densification is heated in an oven into which a reaction gas containing at least one carbon-precursor hydrocarbon is admitted, the effluent gas being extracted from the oven via an extraction pipe (26) connected to an outlet from the oven. The content in the effluent gas of at least one compound selected from allene, propine, and benzene is measured, and as a function of the measured content, the process is controlled by adjusting at least one parameter selected from the rate at which the reaction gas is admitted into the oven, the rate at least one component of the reaction gas is admitted into the oven, the transit time of the gas through the oven, the temperature to which the substrate(s) is/are heated, and the pressure that exists inside the oven. The at least one parameter is adjusted in such a manner as to maintain the measured content at a value which is substantially constant. A densification process can thus be controlled in real time or modelled.

9 Claims, 5 Drawing Sheets

OTHER PUBLICATIONS

Birakayala et al. A reduced reaction model for carbon CVD/CVI processes. Carbon 40 (2002) 675-683.*

Chemical Vapor Infiltration, http://en.wikipedia.org/wiki/Chemical_vapor_infiltration. Retrieved Sep. 30, 2009.*

Glasier, G.F. et al: "Formation of pyrolytic carbon during the pyrolysis of ethane at high conversions," Carbon, Elsevier Science Publishing, New York, NY, vol. 39, No. 1, pp. 15-23 (Jan. 2001).

Becker, A., et al: "Chemistry and kinetics of chemical vapor deposition of pyrocarbon—II pyrocarbon deposition from ethylene, acetylene and 1,3-butadiene in the low temperature regime," Carbon, Elsevier Science Publishing, New York, NY, vol. 36, No. 3, pp. 177-199 (1998).

Delhaes, P.: "Chemical vapor deposition and infiltration processes of carbon materials," Carbon, Elsevier Science Publishing, New York, NY, vol. 40, No. 5, pp. 641-657 (Apr. 2002).

* cited by examiner

CONTROLLING OR MODELING A CHEMICAL VAPOR INFILTRATION PROCESS FOR DENSIFYING POROUS SUBSTRATES WITH CARBON

This application is a §371 national phase filing of PCT/FR2004/001009 filed Apr. 27, 2004, and claims priority to a French application No. 03 05194 filed Apr. 28, 2003.

BACKGROUND OF THE INVENTION

The invention relates to densifying porous substrates with pyrolytic carbon (PyC) that is deposited within the pores of substrates by chemical vapor infiltration (CVI).

A particular field of application of the invention is making parts out of composite material by densifying porous fiber substrates, in particular substrates made of carbon fibers, with a PyC matrix obtained by chemical vapor infiltration. This produces carbon/carbon (C/C) composite material parts. Because of its thermostructural properties, C/C composite material is suitable for making structural parts that are liable in operation to be exposed to high temperatures, in particular parts for propulsion or structural assemblies in the aerospace field. The friction characteristics of C/C composite materials also make them suitable for constituting friction parts for brakes and clutches, in particular brake disks for airplanes and land vehicles.

The chemical vapor infiltration process is well known. It consists in placing one or more porous substrates for densification inside an oven into which a reaction gas is introduced having at least one component that is a precursor for the material of the matrix to be deposited within the pores of the substrates. The conditions of flow rate, temperature, and pressure are determined so as to enable the gas to diffuse within the pores of the substrates and form therein the desired deposit by one of the components of the gas decomposing or by a plurality of the components of the gas reacting together.

In order to form a PyC matrix, a reaction gas is used that contains one or more gaseous hydrocarbons suitable for producing a carbon deposit by decomposing. A typical example of the reaction gas is a mixture of methane and propane, in which the propane acts as a "dopant" constituting the main source of PyC, while the methane acts essentially as a diluant, encouraging the gas to diffuse into the pores of the substrates, and also providing a fraction of the deposited PyC. The PyC CVI method (the method of depositing a PyC matrix by means of CVI) is generally undertaken at a temperature lying in the range 950° C. to 1100° C., at a pressure of less than 10 kilopascals (kPa).

There exist several PyC CVI processes, and in particular the isothermal method and the temperature gradient method.

In the isothermal process, the substrates for densification are maintained at all times at a temperature that is substantially uniform throughout their volume. A drawback of that process lies in the practical impossibility of achieving densification that is uniform. The matrix material tends to deposit preferentially within the pores that are close to the outside surface of the substrate. Progressive obstruction of the surface pores makes access for the reaction gas to the inside of the substrate more and more difficult, and as a result there is a densification gradient between the surface and the core of the substrate. It is indeed possible to machine the surface or to remove the crust from the substrate one or more times during the densification process in order to open its surface pores. However that requires the process to be interrupted for the time needed to extract the substrate from the densification installation, to cool it, to remove its crust, to reinsert the substrate in the installation, and to return to the desired temperature. The duration of the isothermal PyC CVI process is thus particularly lengthy. Industrially, densifying parts such as C/C composite disk brakes for airplanes using that method commonly requires several hundreds of hours.

With a temperature gradient process, it is possible to a large extent to limit the above-mentioned drawback of the isothermal method. A temperature difference is established within an internal portion of the substrate which is at a higher temperature, and the surface of the substrate which is exposed to the reaction gas. The matrix material then becomes deposited preferentially within the hotter internal portion. By controlling the surface temperature of the substrate so that it remains below the decomposition or reaction threshold of the gas, at least during an initial portion of the densification process, it is possible to ensure that the densification front advances from the inside towards the surface of the substrate as the process continues. In known manner, the temperature gradient can be obtained by placing one or more substrates around a susceptor coupled to an induction coil with an internal face of the substrate(s) in contact with the susceptor. It is also possible to obtain a temperature gradient by direct inductive coupling between the induction coil and the substrate during densification, when the nature of the substrate makes that possible. Those techniques are described in particular in patent documents FR-A-2 711 647 and U.S. Pat. No. 5,348,774.

In document U.S. Pat. No. 5,348,774, the substrates are heated both by coupling with a susceptor and by direct coupling with the substrates as the densification front advances. Means are provided for measuring the variation in substrate weight on a continuous basis so as to monitor how the densification process is progressing. As a function of variation in measured weight, the process can be optimized, in particular concerning its duration, by acting on the parameters of the densification operation, and in particular on the power delivered to the induction coil. Monitoring substrate weight variation can also be used to determine when the end of the densification process has been reached. In comparison with the isothermal method, the temperature gradient method does indeed enable densification to be obtained that is less heterogeneous, however it can be implemented only with substrates of a particular shape, and specifically with substrates that are annular.

Varying densification parameters throughout a CVI process is envisaged in patent document U.S. Pat. No. 6,001,419. That document provides a method of controlling the microstructure of the deposited material. When the material is PyC, it is known that by modifying infiltration conditions it is possible in particular to obtain a pyrocarbon of a smooth laminar type, of a dark laminar type, of a rough laminar type, or of an isotropic type. The microstructure of the pyrocarbon is a characteristic that is important for the properties of the densified substrate. Thus, with carbon/carbon composite material parts, it is often desirable to have a microstructure of the rough laminar type, in particular because of the ease with which it can be turned into graphite by heat treatment.

The method of patent document U.S. Pat. No. 6,001,419 is effective in controlling the microstructure of the deposited PyC, but it also presents the advantage of obtaining a significant reduction in the total duration of the densification process. The densification parameters are varied in accordance with a predefined model.

OBJECT AND SUMMARY OF THE INVENTION

An object of the invention is to provide a method enabling a process of densifying porous substrates with pyrolytic carbon to be controlled in real time or to be modelled (i.e. predefined) so as to optimize infiltration parameters, specifically in order to reduce the total duration of densification.

More particularly, the invention seeks to achieve such control or such modeling in self-adaptive manner, taking account of the real conditions under which the chemical vapor infiltration process is taking place.

This object is achieved by a method of controlling or modeling a process comprising: placing a load comprising one or more porous substrates to be densified in an oven; heating the substrate(s); admitting a reaction gas into the oven, the reaction gas containing at least one carbon-precursor hydrocarbon; adjusting the pressure in the oven so as to enable the gas to diffuse within the pores of the heated substrate(s) so as to form a deposit of pyrolytic carbon therein; and extracting effluent gas from the oven via an extraction pipe connected to an outlet from the oven;

wherein according to the invention, the method comprises measuring the content in the effluent gas of at least one compound selected from allene, propine, and benzene; and, as a function of the measured content, controlling the process by adjusting at least one parameter selected from: the flow rate of the reaction gas admitted into the oven, the flow rate of at least one component of the gas admitted into the oven, the transit time of the gas through the oven, the temperature to which the substrate(s) is/are heated, and the pressure that exists inside the oven.

It has been shown by the Applicant that amongst the species contained in the effluent gas coming from decomposition and recomposition of the components of the reaction gas, allene, propine, and benzene constitute good indicators of pyrolytic carbon deposition rate, and that the content of these compounds in the effluent gas can be measured quite easily.

The method of the invention makes it possible to optimize the process in real time, leading to a reduction in the total duration of the process until a desired density is obtained. In addition to reducing the time required to fabricate densified parts, and consequently achieving greater availability for the densification installation, the method of the invention serves for any given densification cycle to achieve significant savings in the energy needed for heating and in the consumption of reaction gas.

The process may advantageously be controlled so as to maintain the measured content at a value that is substantially constant.

The allene, propine, or benzene content can be measured in a duct in parallel with the effluent gas extraction pipe. Measurements can be performed by gas chromatography, for example.

In a particular implementation of the invention, control is performed by adjusting the flow rate of the reaction gas or the flow rate of a component of the gas as a function of the measured allene or propine content.

In another particular implementation of the invention, control is performed by adjusting the temperature, the pressure, or the transit time of the gas, as a function of the measured benzene content.

The gas includes at least one precursor of pyrolytic carbon that is preferably selected from alkanes, alkynes, and alkenes, and more particularly propane, butane, and ethane diluted in methane or natural gas, or in an inert gas, e.g. nitrogen.

Also advantageously, the end of the densification process is detected by it becoming impossible to control variation in the measured content by adjusting the selected parameter. This makes it possible to determine the duration of the densification process.

The method of the invention makes it possible in real time and in self-adaptive manner to control the densification conditions of one or more substrates in a chemical vapor infiltration installation.

For a given chemical vapor infiltration installation and for a typical substrate load, the method of the invention makes it possible to model the densification process by performing one or more initial densification cycles. The model or template for parameter variation as predefined in this way is stored for subsequent application to similar substrate loads without it being necessary to analyze the effluent gases. The duration of the densification process as optionally determined during the modeling step may also be stored.

BRIEF DESCRIPTION OF THE DRAWINGS

The invention will be better understood on reading the following description given by way of non-limiting indication and made with reference to the accompanying drawings, in which.

DETAILED DESCRIPTION OF IMPLEMENTATIONS OF THE INVENTION

Figure 1:
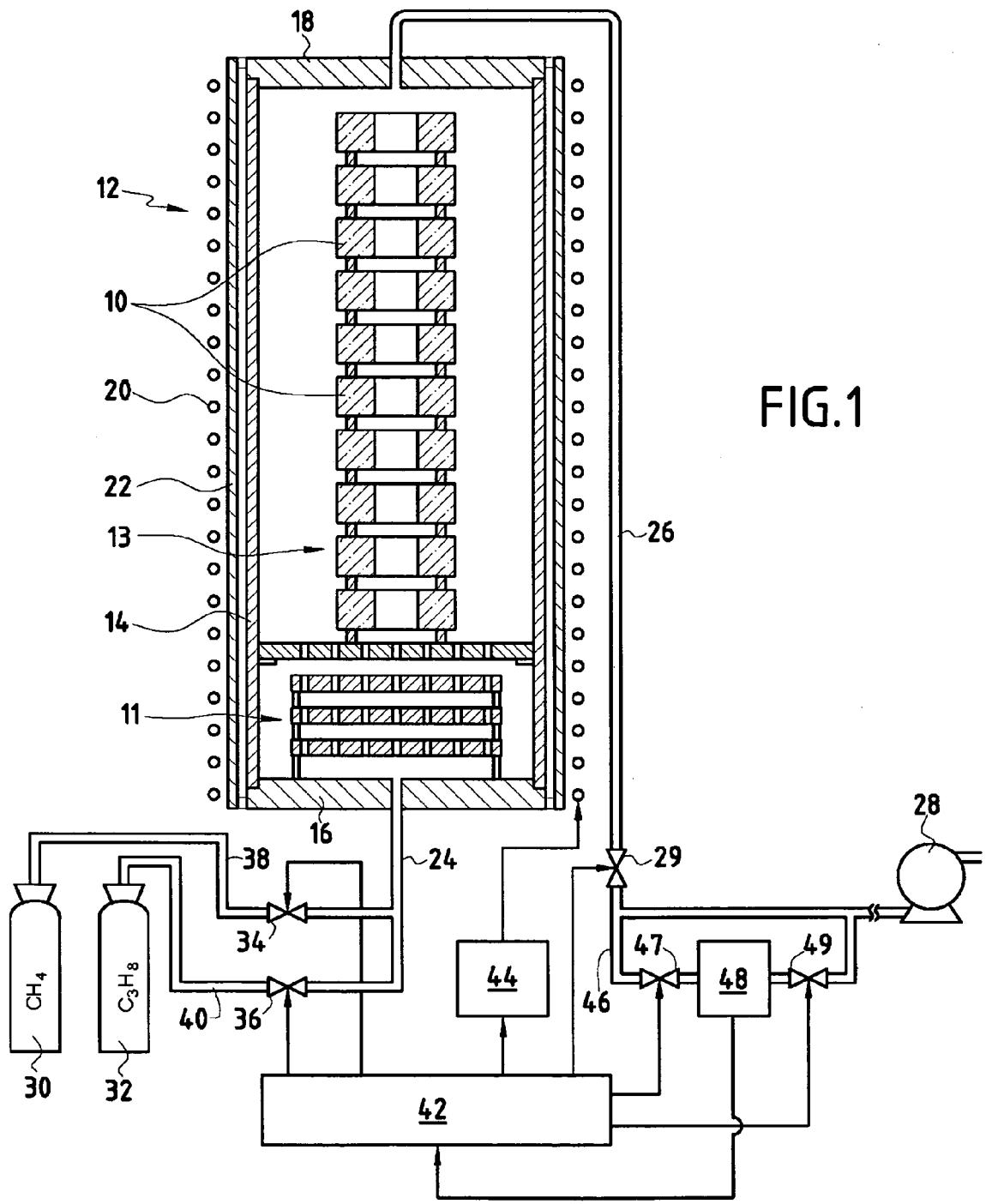
FIG. 1 is a highly diagrammatic view of a chemical vapor infiltration installation suitable for implementing a method in accordance with the invention.
Figure 2:
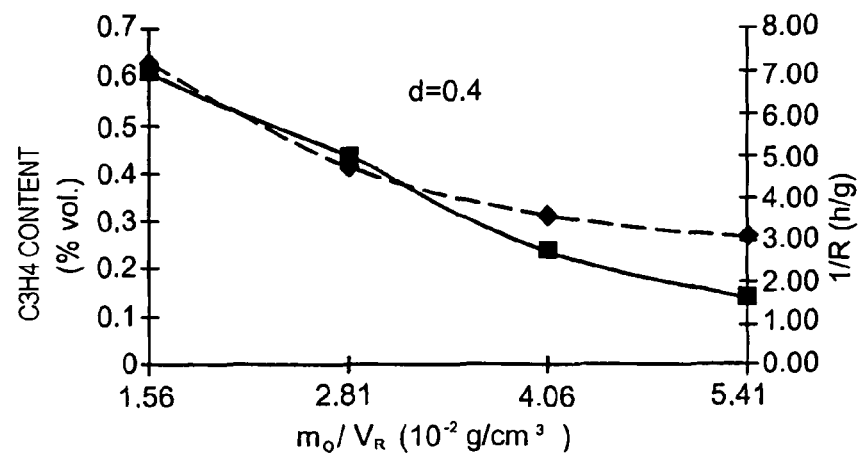
FIGS. 2 to 6 are graphs showing the influence of the weight and the density of substrates on the allene and propine content of the effluent gas.
Figure 3:
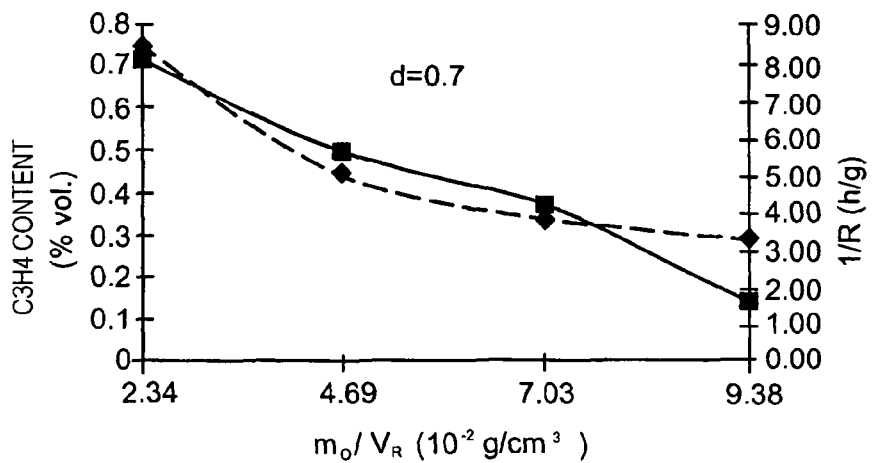
Figure 4:
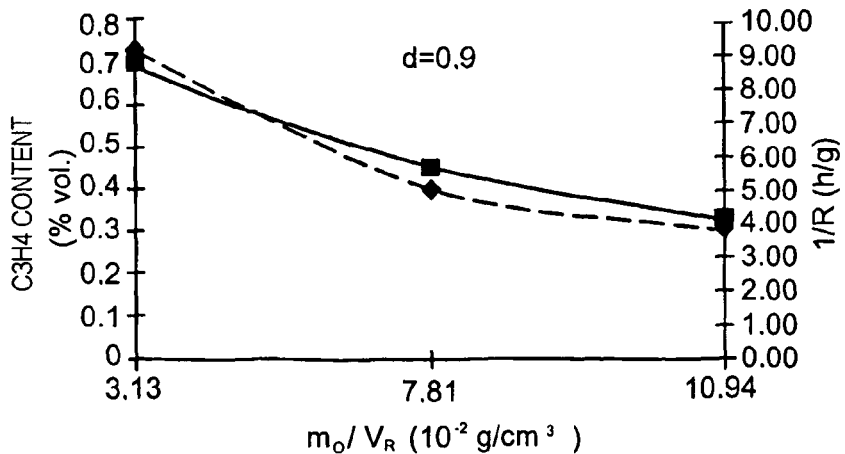
Figure 5:
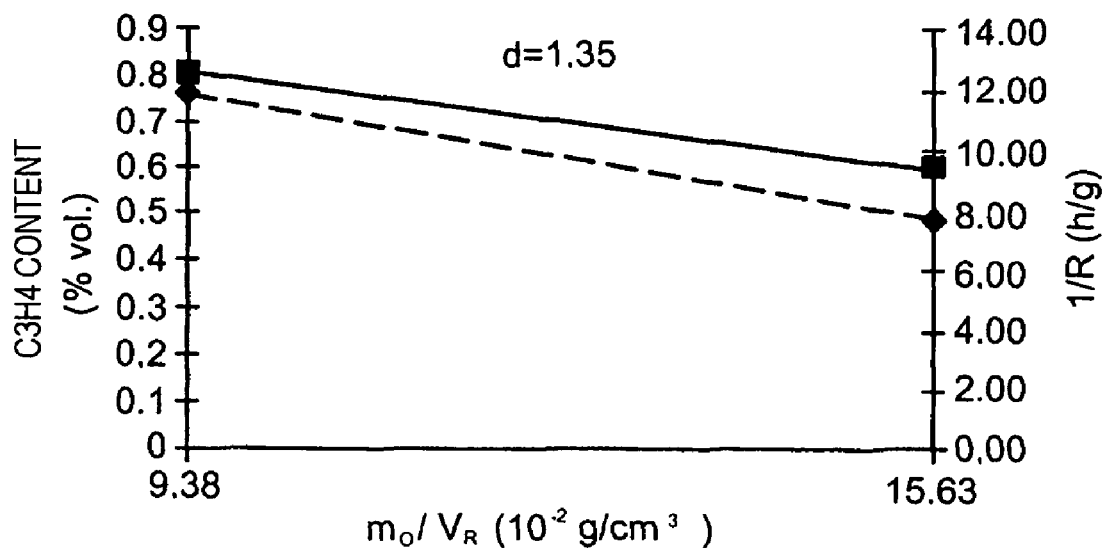
Figure 6:
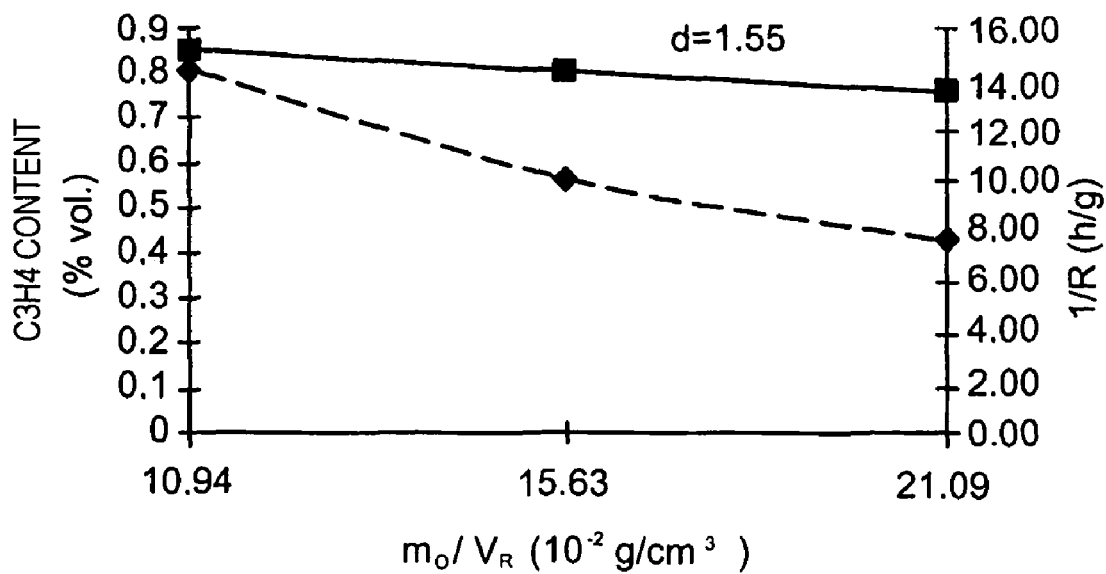

A chemical vapor infiltration installation is shown very diagrammatically in FIG. 1.

Porous substrates 10 for densifying are placed inside an oven 12 comprising a cylindrical side wall 14, a bottom wall 16, and a cover 18. The wall 14 is made of graphite and constitutes a susceptor that is inductively coupled with an induction coil 20 that is separated from the wall 14 by insulation 22. The assembly is housed in a metal casing (not shown).

By way of example, the substrates 10 are annular preforms made of carbon fibers. The preforms are disposed in a vertical stack, being spaced apart from one another by spacers.

A reaction gas is admitted into the oven via a feed pipe 24 connected to an inlet orifice that opens out in the bottom 16. Inside the oven, the gas passes through a preheater zone 11 prior to reaching the zone 13 in which the substrates 10 are loaded. By way of example, the preheater zone comprises a plurality of perforated graphite plates which are raised to the temperature of the oven. In contact with these plates, the reaction gas is preheated prior to reaching the loaded zone.

The effluent gas is extracted via an outlet orifice that opens through the cover 18 and that is connected to an extraction pipe 26. This pipe connects the oven to a suction device 28 such as a pump. A valve 29 mounted in the pipe 26 enables the level of pressure inside the oven to be adjusted. One or more purification devices, in particular a tar trap (not shown) can be mounted along the pipe 26 upstream from the suction device.

The reaction gas is constituted by a mixture of gases whose components are stored in cylinders or tanks 30, 32. By way of example, it is possible to use a gas constituted by a mixture of methane ($CH_4$) and propane ($C_3H_8$). The propane or "dopant" gas then constitutes the main precursor of the pyrolytic carbon, which it produces by means of a decomposition process that takes place under the temperature and pressure conditions that exist inside the oven. The methane performs a diluting function that encourages the gas to diffuse within the pores of the substrates, and it also contributes, to a lesser extent, to forming PyC. It should be observed that butane ($C_4H_{10}$), propylene, or ethane ($C_2H_6$) could also be used as dopant gas instead of or together with propane. Valves 34 and 36 are mounted in the pipes 38 and 40 connecting the methane and propane tanks 30 and 32 to the feed pipe so as to make it possible to adjust the respective mass flow rates of methane and propane. The valves 34 and 36 are controlled by a control circuit 42. This circuit is also connected to the valve 29 so as to control the pressure in the oven and to a circuit 44 for feeding electricity to the induction coil 20 so as to control the heating power in the oven. The oven is provided with temperature and pressure sensors (not shown) supplying the control circuit 42 with signals that are representative of the temperature and the pressure in the oven. The temperature sensor may be constituted by at least one optical pyrometer supported by the cover 18 and measuring the surface temperature of the substrates. The pressure sensor may be housed at the outlet from the oven.

An installation of the kind described above is well known per se.

A duct 46 is connected in parallel with the extraction pipe 26. A device 48 is mounted in the duct 46 between two valves 47 and 49 in order to measure the content in the effluent gas of one or more selected gaseous species that are representative of the rate of PyC deposition within the substrates 10. By way of example, the measuring device is a gas chromatography device. It would also be possible to use a device that performs analysis by spectroscopic methods.

The device 48 is connected to the control circuit 42 so as to provide the control circuit with a signal that is representative of the measured content or contents. Measurements are performed periodically by the control circuit 42 opening the valves 47 and 49.

The chemical vapor infiltration process depends on several parameters, and in particular:
- the flow rate of the reaction gas;
- the particular flow rate of one or more components of the gas, and in particular in the above example the doping gas flow rate;
- the temperature to which the substrates are heated;
- the pressure that exists inside the oven; and
- the transit time of the reaction gas through the oven.

It should be observed that the last two parameters, i.e. pressure P and transit time $\tau$, are related to each other since the transit time is usually defined by the equation:

$$\tau = \frac{V}{Q}$$

where V is the inside volume of the oven through which the gas can pass, and Q is the flow rate at which the gas is admitted. The volume V includes the volume of the accessible pores in the substrates that are loaded into the oven. The transit time $\tau$ depends on the extent to which the oven is loaded and it varies to some extent as the process of densifying the substrates continues, other things remaining equal.

The Applicant has found that amongst the species contained in the effluent gas, allene a-$C_3H_4$, propine p-$C_3H_4$, and benzene $C_6H_6$ present contents that are representative of the PyC formation rate and that vary perceptibly as a function of one or more of the above-mentioned densification parameters.

Tests have been carried out in an installation of the type shown in FIG. 1 but of smaller size than an industrial installation, with the volume $V_R$ of the oven being 640 cubic centimeters ($cm^3$) of which 50 $cm^3$ correspond to the preheater zone. The volume $V_R$ of the oven is related to the above-defined volume V by the equation:

$$V_R = V + V_S$$

in which $V_S$ is the volume represented by those portions of the substrates that do not have accessible pores.

The porous substrates used for testing were annular fiber structures of carbon fibers having an outside diameter of 35 millimeters (mm), an inside diameter of 15 mm, and thickness of 15 mm. The initial volume fraction of the substrate, i.e. the apparent fraction of the substrate volume occupied by the pores was about 80%, giving the substrates an initial specific gravity (or relative density) of 0.4. The substrates were placed in a vertical stack and were spaced apart from one another by graphite spacers having a thickness of 3 mm, without closing off the gaps between the substrates.

The substrates were obtained by being cut out from plates made up of superposed fiber plies bonded together by needling. Each ply was in the form of a multidirectional sheet made up of two unidirectional sheets, i.e. made up of filamentary elements disposed parallel to a common direction, the unidirectional sheets being superposed with different directions and being bonded together by light needling. It should be observed that this type of fiber structure is well known in the field of making brake disks out of C/C composite materials.

Test 1

Chemical vapor infiltration processes were implemented using substrates at different stages of densification, and in each case with different loads.

The parameters of the method were determined as follows: reaction gas constituted by a $CH_4/C_3H_8$ mixture with respective volume proportions of 0.9/0.1, temperature equal to about 1000° C., pressure equal to about 1.3 kPa, and transit time equal to about 1 second (s).

Table I below gives the total measured content of allene and propine for substrates of different relative densities d lying in the range 0.4 to 1.55, i.e. going from substrates at the beginning of densification to substrates at the end of densification, and for different ratios of $m_0/V_R$ (in grams per cubic centimeter ($g/cm^3$)), where $m_0$ is the total initial mass of the substrates loaded into the oven, and $V_R$ is the volume of the oven.

The total allene plus propine content is expressed in terms of volume percentage in the effluent gas.

TABLE I

| Density (d) $m_o/V_R$ $10^{-2}$ g/cm³ | 0.4 | 0.7 | 0.9 | 1.35 | 1.55 |
|---|---|---|---|---|---|
| 1.56 | 0.61 | | | | |
| 2.34 | | 0.72 | | | |
| 2.81 | 0.43 | | | | |
| 3.13 | | | 0.69 | | |
| 4.06 | 0.24 | | | | |
| 4.69 | | 0.5 | | | |
| 5.47 | 0.14 | | | | |
| 7.03 | | 0.37 | | | |
| 7.81 | | | 0.45 | | |
| 9.38 | | 0.15 | | 0.80 | |

TABLE I-continued

| Density (d) $m_o/V_R 10^{-2}$ g/cm³ | 0.4 | 0.7 | 0.9 | 1.35 | 1.55 |
|---|---|---|---|---|---|
| 10.94 | | | 0.33 | | 0.84 |
| 15.63 | | | | 0.60 | 0.80 |
| 21.09 | | | | | 0.76 |

These results are plotted on the curves of FIGS. 2 to 6 for the various densities d of the substrates.

FIGS. 2 to 6 also show in dashed lines curves that represent variation in 1/R as a function of $m_0/V_R$, where R is the deposition rate expressed in grams per hour (g/h).

It can be seen that the total $C_3H_4$ content varies in the opposite direction to the deposition rate and that there is a correlation between the deposition rate and the measured content. It should also be observed that the relationship between the weight of the substrates and the total $C_3H_4$ content is always satisfied, although to a smaller extent, as density increases, with the influence of substrate weight on the total $C_3H_4$ content and on the deposition rate being smaller for substrates of high density.

Test 2

The procedure was the same as for Test 1, except that the transit time was raised to about 2 s.

Table II gives the total measured content of $C_3H_4$ for the same range of loads as in Test 1.

TABLE II

| Density (d) $m_o/V_R 10^{-2}$ g/cm³ | 0.4 | 0.7 | 0.9 | 1.35 | 1.55 |
|---|---|---|---|---|---|
| 1.56 | 0.43 | | | | |
| 2.34 | | 0.50 | | | |
| 2.81 | 0.30 | | | | |
| 3.13 | | | 0.48 | | |
| 4.06 | 0.17 | | | | |
| 4.69 | | 0.35 | | | |
| 5.47 | 0.08 | | | | |
| 7.03 | | 0.26 | | | |
| 7.81 | | | 0.32 | | |
| 9.38 | | 0.11 | | | |
| 10.94 | | | 0.23 | | 0.59 |
| 15.63 | | | | 0.42 | 0.55 |
| 21.09 | | | | | 0.51 |

These results confirm the conclusions drawn from Test 1. They also indicate that there is a reduction in the total measured $C_3H_4$ content due to the increase in the transit time.

Test 3

The procedure was the same as for Test 1, except that the transit time was reduced to 0.75 and the temperature was 1050° C.

Table III below gives the total measured content of $C_3H_4$ for the same range of loads as in Test 1.

TABLE III

| Density (d) $m_o/V_R 10^{-2}$ g/cm³ | 0.4 | 0.7 | 0.9 | 1.35 | 1.55 |
|---|---|---|---|---|---|
| 1.56 | 0.69 | | | | |
| 2.34 | | 0.84 | | | |
| 2.81 | 0.48 | | | | |
| 3.13 | | | 0.79 | | |
| 4.06 | 0.28 | | | | |
| 4.69 | | 0.59 | | | |
| 5.47 | 0.13 | | | | |

TABLE III-continued

| Density (d) $m_o/V_R 10^{-2}$ g/cm³ | 0.4 | 0.7 | 0.9 | 1.35 | 1.55 |
|---|---|---|---|---|---|
| 7.03 | | 0.44 | | | |
| 7.81 | | | 0.53 | | |
| 9.38 | | 0.18 | | 0.90 | |
| 10.94 | | | 0.38 | | 0.92 |
| 15.63 | | | | 0.68 | 0.87 |
| 21.09 | | | | | 0.82 |

These results confirm the conclusions drawn from Tests 1 and 2.

Test 4

The procedure was the same as for Test 1, but $C_3H_8$ was replaced by another dopant, namely butane $C_4H_{10}$, with the volume ratio $CH_4/C_4H_{10}$ being likewise 0.9/0.1.

Table IV below gives the total measured $C_3H_4$ content for the same range of substrate loads as in Test 1.

TABLE IV

| Density (d) $m_o/V_R 10^{-2}$ g/cm³ | 0.4 | 0.7 | 0.9 | 1.35 | 1.55 |
|---|---|---|---|---|---|
| 1.56 | 0.67 | | | | |
| 2.34 | | 0.80 | | | |
| 2.81 | 0.47 | | | | |
| 3.13 | | | 0.76 | | |
| 4.06 | 0.26 | | | | |
| 4.69 | | 0.55 | | | |
| 5.47 | 0.12 | | | | |
| 7.03 | | 0.41 | | | |
| 7.81 | | | 0.49 | | |
| 9.38 | | 0.16 | | 0.88 | |
| 10.94 | | | 0.36 | | 0.89 |
| 15.63 | | | | 0.64 | 0.84 |
| 21.09 | | | | | 0.80 |

These results are entirely comparable with those of Test 1.

Test 5

The procedure was the same as for Test 4, but with the transit time raised to 2 s.

Table V below gives the total measured $C_3H_4$ content for the same range of loads as in Test 1.

TABLE V

| Density (d) $m_o/V_R 10^{-2}$ g/cm³ | 0.4 | 0.7 | 0.9 | 1.35 | 1.55 |
|---|---|---|---|---|---|
| 1.56 | 0.47 | | | | |
| 2.34 | | 0.56 | | | |
| 2.81 | 0.33 | | | | |
| 3.13 | | | 0.53 | | |
| 4.06 | 0.18 | | | | |
| 4.69 | | 0.39 | | | |
| 5.47 | 0.08 | | | | |
| 7.03 | | 0.29 | | | |
| 7.81 | | | 0.34 | | |
| 9.38 | | 0.11 | | 0.62 | |
| 10.94 | | | 0.25 | | 0.62 |
| 15.63 | | | | 0.45 | 0.59 |
| 21.09 | | | | | 0.55 |

These results are entirely comparable with those of Test 2.

Test 6

The procedure was the same as for Test 3, but the $C_3H_8$ was replaced by another dopant, namely ethane $C_2H_6$, with the volume ratio $CH_4/C_2H_6$ being likewise 0.9/0.1.

Table VI below gives the total measured $C_3H_4$ content for the same range of loads as in Test 1.

TABLE VI

| Density (d) $m_o/V_R\,10^{-2}\,g/cm^3$ | 0.4 | 0.7 | 0.9 | 1.35 | 1.55 |
|---|---|---|---|---|---|
| 1.56 | 0.51 | | | | |
| 2.34 | | 0.63 | | | |
| 2.81 | 0.36 | | | | |
| 3.13 | | | 0.59 | | |
| 4.06 | 0.21 | | | | |
| 4.69 | | 0.44 | | | |
| 5.47 | 0.10 | | | | |
| 7.03 | | 0.33 | | | |
| 7.81 | | | 0.40 | | |
| 9.38 | | 0.14 | | 0.68 | |
| 10.94 | | | 0.29 | | 0.69 |
| 15.63 | | | | 0.51 | 0.65 |
| 21.09 | | | | | 0.62 |

Similar conclusions can be drawn to those deduced from Test 1.

Test 7

The procedure was as in Test 1, but operating at a temperature of about 950° C. and at a pressure of about 1.9 kPa.

Table VII below gives the total measured $C_3H_4$ content for the same range of loads as in Test 1.

TABLE VII

| Density (d) $m_o/V_R\,10^{-2}\,g/cm^3$ | 0.4 | 0.7 | 0.9 | 1.35 | 1.55 |
|---|---|---|---|---|---|
| 1.56 | 0.39 | | | | |
| 2.34 | | 0.50 | | | |
| 2.81 | 0.27 | | | | |
| 3.13 | | | 0.47 | | |
| 4.06 | 0.16 | | | | |
| 4.69 | | 0.35 | | | |
| 5.47 | 0.07 | | | | |
| 7.03 | | 0.26 | | | |
| 7.81 | | | 0.32 | | |
| 9.38 | | 0.11 | | 0.54 | |
| 10.94 | | | 0.23 | | 0.55 |
| 15.63 | | | | 0.40 | 0.52 |
| 21.09 | | | | | 0.49 |

Test 8

The procedure was the same as in Test 7, but operating at a pressure of about 1 kPa.

Table VIII below gives the overall measured value of $C_3H_4$ for the same range of loads as in Test 1.

TABLE VIII

| Density (d) $m_o/V_R\,10^{-2}\,g/cm^3$ | 0.4 | 0.7 | 0.9 | 1.35 | 1.55 |
|---|---|---|---|---|---|
| 1.56 | 0.38 | | | | |
| 2.34 | | 0.48 | | | |
| 2.81 | 0.27 | | | | |
| 3.13 | | | 0.46 | | |
| 4.06 | 0.17 | | | | |
| 4.69 | | 0.34 | | | |
| 5.47 | 0.08 | | | | |
| 7.03 | | 0.25 | | | |
| 7.81 | | | 0.32 | | |
| 9.38 | | 0.11 | | 0.52 | |
| 10.94 | | | 0.24 | | 0.52 |
| 15.63 | | | | 0.40 | 0.51 |
| 21.09 | | | | | 0.48 |

The results of Tests 7 and 8 are very similar. Varying pressure between Tests 7 and 8 seems to have little influence.

In the prior art, PyC CVI methods have traditionally been implemented with fixed values for the densification parameters.

For each parameter, it has been a practice to select a value that is intermediate between a first value which would be the optimum value for use at the beginning of the densification process when the pores of the substrates are easily accessible, and a second value which would be the optimum value for use when diffusion of the reaction gas into the pores of the substrates becomes less easy. The optimum values are determined in particular by the type of PyC microstructure that is desired. For reaction gas flow rate, for concentration of the dopant in the gas, for temperature, and for pressure, the first value is greater than the second. For gas transit time, the opposite applies.

If, for each parameter, a constant value were to be selected that is at or very close to the optimum value at the end of the process, then deposition rate would be low, and the duration of the process would be lengthened. In contrast, if a value were to be selected that is equal to or very close to the optimum value at the beginning of the process, then that would not contribute to increasing the deposition rate at the end of the process, when deposition rate depends essentially on diffusion, but would lead firstly to an increase in the risk of premature blockage of the pores by surface deposits, and secondly to encouraging PyC to be deposited with an undesirable microstructure, or even to undesirable substances being deposited, such as soot.

The tests described above show that certain species contained in the effluent gas are representative of deposition rate, and that the content of those species in the effluent gas varies as a function of one of more densification parameters.

In the present invention, use is made of these observations to control the PyC CVI process by acting on at least one densification parameter as a function of the measured content of one or more particular species in the effluent gas, so as to optimize the densification process.

The species concerned are allene, propine, and benzene. The tests described above show the influence on $C_3H_4$ content both of transit time and of temperature. Other tests performed without a load have shown that the measured content of allene and propine is sensitive to the dopant content of the reaction gas mixture and to its mass flow rate, and that the measured benzene content is sensitive to temperature.

For the or each densification parameter on which it is decided to take action, adjustment is preferably performed within a range of values. For the various parameters mentioned above, the maximum value is that which can be set at the beginning of the densification process. It is selected in particular as a function of the porosity characteristics of the substrates to be densified and as a function of the type of PyC microstructure that is desired. The minimum value thereof is the value below which it is not desirable or useful to drop at the end of the densification process.

Thus, for example, for densifying fibrous substrates of carbon fibers of the kind commonly used for making C/C composite material parts, in particular airplane brake disks, and for forming PyC of the rough laminar type, the range over which these various parameters can vary may be selected as follows:

temperature lying in the range 900° C. to 1100° C., so as to comply with the PyC microstructure;
pressure lying in the range 0.1 kPa to 10 kPa so as to comply with the PyC microstructure and so as to limit technical constraints of establishing and maintaining very low pressures inside the oven;

transit times lying in the range 0.5 s to 5 s, in particular to avoid the gas maturing which would lead to unwanted deposits; and in a reaction gas containing methane and one or more dopant gases, in particular propane, butane, or ethane, a dopant volume ratio lying in the range 0% to 70%, or in the range 0% to 100%, it being possible for the reaction gas to be constituted solely by the dopant at the beginning of densification.

The total flow rate of the reaction gas is also determined by the mass of the fiber substrates to be densified, so as to ensure that each substrate is fed with reaction gas.

Because the deposition rate at the beginning of the densification process is determined more by densification parameters than by the ability of the reaction gas to diffuse within the substrates, it is preferable to select the starting value for the or each variable parameter to be the maximum value in the pre-established range, or a value close to said maximum value, except for transit time where it is preferable to select the minimum value or a value close to said minimum value.

The process is subsequently controlled so as to maintain the allene, propine, and/or benzene content at a value that is substantially constant and equal to that measured at the beginning of the densification process. This reference value may be the value measured after several hours, or a value comprising the mean of a plurality of measurements performed at the beginning of the process, so as to wait for the process to stabilize. Because the process progresses slowly, there is no need to measure the monitored content on a continuous basis. It can be sufficient to perform measurements periodically, e.g. at intervals of 0.25 hour (h) to 1 h.

The measured content can be maintained at a substantially constant value providing the measured content remains within a range [T−20%, T+20%] where T is the reference value established at the beginning of the process.

In practice, maintaining the measured content at a substantially constant value leads to those densification parameter(s) that are adjusted during the process decreasing progressively, with the exception of transit time which increases.

The end of the densification process can be detected when it is found that adjusting the selected variable parameter(s) can no longer maintain the measured content at a value that is substantially constant within the predetermined variation range. In practice, an uncontrollable increase in the measured content is generally then observed. The end of the densification process may be deemed to occur when the measured content exceeds a predetermined threshold that is selected to be equal to or greater than the upper limit of the range allowed for said content.

Implementations of the method of the invention are described below.

A plurality of fiber substrates were loaded at an initial relative density of 0.4, representing a ratio $m/V_R$ equal to $5.47 \times 10^{-2}$ g/cm$^3$. The substrates were densified until reaching a final relative density equal to about 1.6.

Example 9

A reaction gas was used containing a $CH_4/C_3H_8$ mixture. The PyC CVI process was performed by adjusting the temperature inside the oven to a value equal to about 1000° C., the pressure to a value equal to about 1.3 kPa, and the transit time to 1±0.30 s, with variation in transit time being directly associated with variations in flow rate.

The allene and propine content (total $C_3H_4$ content) was measured periodically, and the $C_3H_8$ content in the gas mixture was adjusted by the control unit 42 controlling the valve 36 so as to maintain the measured content substantially equal to 0.2. At the beginning of the process, the dopant fraction, i.e. the molar percentage of $C_3H_8$ in the reaction gas, needed to be set at 50%.

Figure 7:
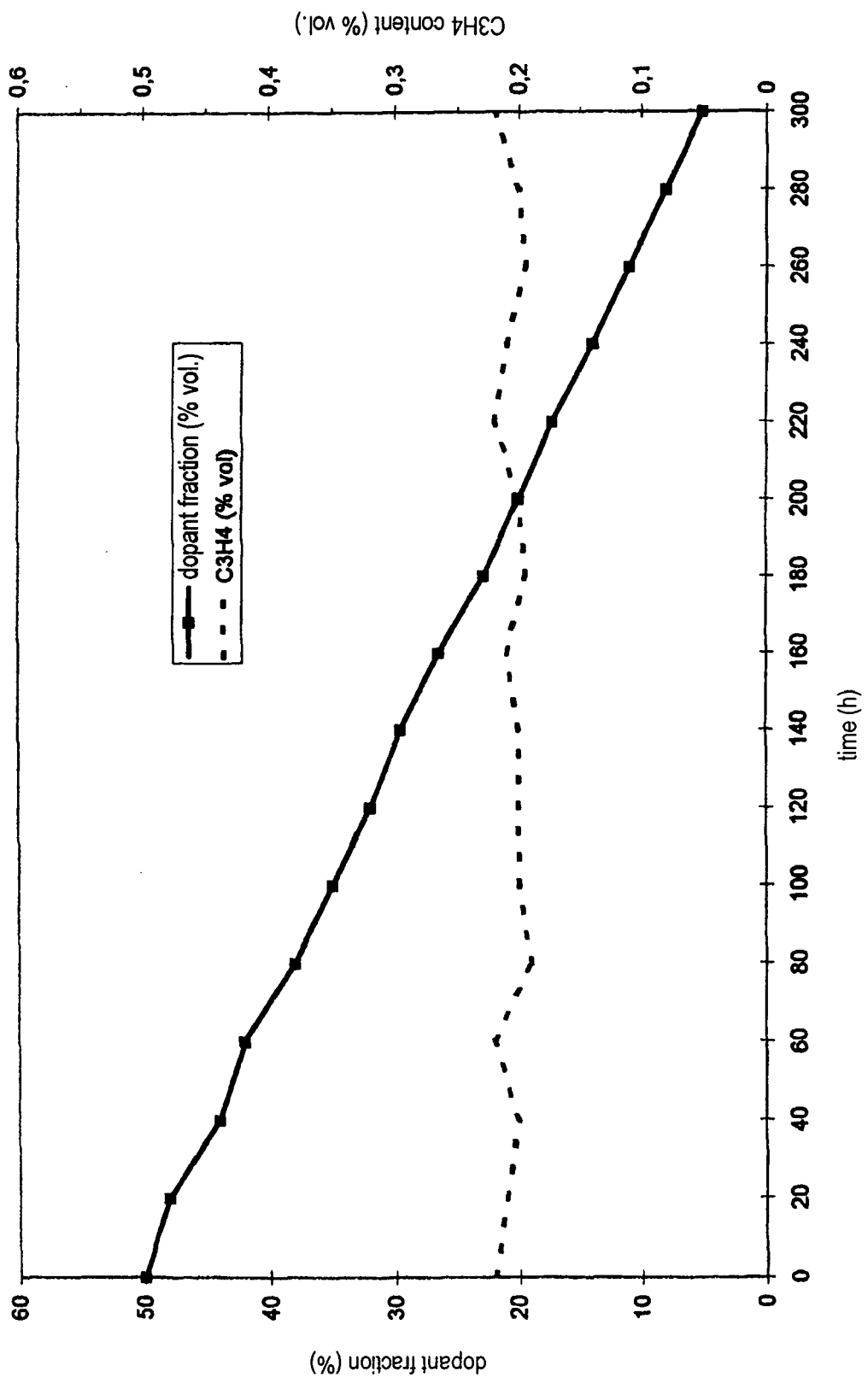
FIG. 7 is a graph showing the densification process being controlled by varying the mass flow rate of one of the components of the gas on the basis of measuring the allene and propine content of the effluent gas.

FIG. 7 shows how the measured $C_3H_4$ content and the measured $C_3H_8$ dopant fraction varied over time. It can be seen that maintaining the total $C_3H_4$ content at a substantially constant value led to a progressive decrease in the dopant fraction until it had been reduced to a value of about 5% at the end of the densification process.

By way of comparison, a PyC CVI process was performed under the same conditions except that the molar fraction of the $C_3H_8$ dopant was maintained constant and equal to about 10%. The time needed to reach a relative density equal to about 1.6 was 40% longer than that required for the PyC CVI process with varying dopant fraction.

Example 10

A reaction gas was used comprising a $CH_4/C_4H_{10}$ mixture having a dopant volume fraction of 10%. The PyC CVI process was performed by adjusting the pressure in the oven to a value of about 1.0 kPa and the transit time to a value of about 1 s.

The benzene ($C_6H_6$) content of the effluent gas was measured periodically and the temperature in the oven was adjusted by the control circuit 42 controlling the power supply circuit 44 so as to maintain the measured content substantially constant and equal to the value measured at the beginning of the densification process. The temperature was fixed to a value of 1100° C. at the beginning of the process.

Figure 8:
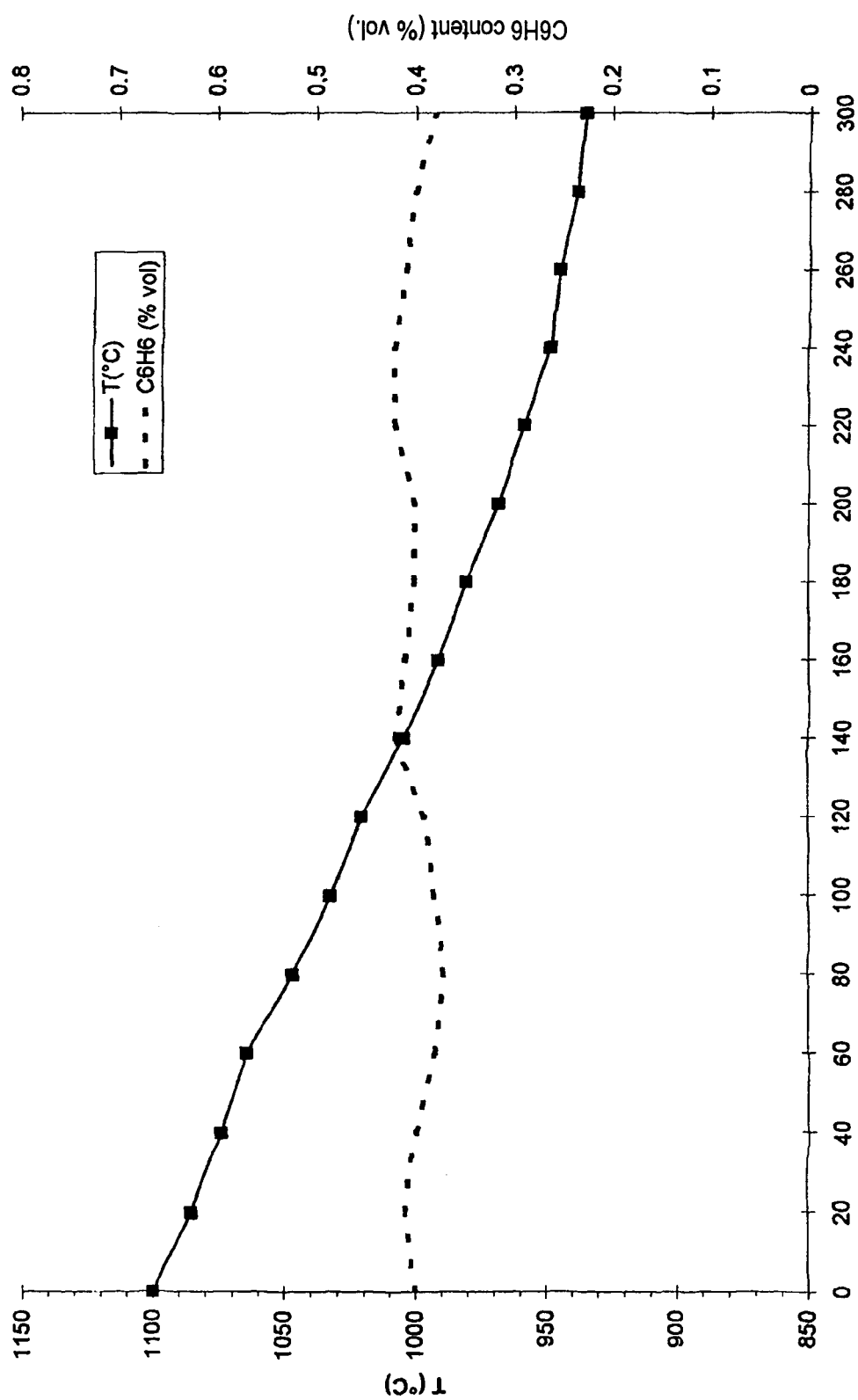
FIG. 8 is a graph showing the densification process being controlled by varying temperature on the basis of the measured benzene content of the effluent gas.

FIG. 8 shows how the measured $C_6H_6$ content and the temperature varied over time. It can be seen that maintaining the measured content constant led to the temperature being reduced progressively down to a value equal to about 950° C. at the end of the densification process.

By way of comparison, a PyC CVI process was undertaken under the same conditions, with the exception of the temperature which was maintained constant and equal to about 1000° C. The time needed to reach a relative density equal to about 1.6 was 30% longer than that for the PyC CVI process with varying temperature.

Examples 9 and 10 confirm the effectiveness of the method of the invention in reducing the time required for densification by optimizing the PyC CVI process. This reduction in time is associated with a reduction in the quantity of reaction gas that is consumed and a reduction in the emission of certain substances such as polycyclic aromatic hydrocarbons in the effluent gas.

Although Examples 9 and 10 relate to acting on a single densification parameter, a plurality of parameters can be varied during the same densification process.

The method of the invention is suitable for real time control of the densification process by measuring the allene, propine content, and/or the benzene content in the effluent gas and by adjusting at least one densification parameter.

The method of the invention is also suitable for modeling a densification process for a given chemical vapor infiltration installation and for a typical load of substrates to be densified. During one or more densification cycles for modeling purposes, the method is implemented with at least densification parameter being adjusted as a function of the measured allene, propine content, and/or the benzene content. The variation in the or each adjusted densification parameter is stored, as is the duration of the densification process. The model as established in this way is subsequently reproduced during the process of densifying substrate loads of the same type, repeating the variation in the same densification parameter(s) and performing densification over the same duration as during the modeling cycle(s).

Finally, although the invention is described in an application for densifying a load of substrates constituted by a stack of annular preforms, the method of the invention is naturally applicable to densifying one or more substrates of any shape.

The invention claimed is:

1. A method of controlling or modeling the process of densifying at least one porous substrate with pyrolytic carbon by chemical vapor infiltration, the process comprising: placing a load comprising one or more porous substrates to be densified in an oven; heating the substrate(s); admitting a reaction gas into the oven, the reaction gas containing at least one carbon-precursor hydrocarbon selected in the group of propane, butane, propylene and ethane; adjusting the pressure in the oven so as to enable the gas to diffuse within the pores of the heated substrate(s) so as to form a deposit of pyrolytic carbon therein; and extracting effluent gas from the oven via an extraction pipe connected to an outlet from the oven;
the method being characterized by measuring the content in the effluent gas of at least one compound selected from allene and propine; and controlling the process by adjusting at least the flow rate of the carbon-precursor hydrocarbon admitted into the oven to maintain the measured content at a substantially constant value.

2. A method according to claim 1, wherein the content is measured in a duct in parallel with the extraction pipe.

3. A method according to claim 1, wherein the content is measured by gas chromatography.

4. A method according to claim 1, wherein the carbon-precursor hydrocarbon is diluted in methane or in an inert gas.

5. A method according to claim 1, wherein the flow rate is adjusted within a predetermined range of values.

6. A method according to claim 5, wherein the end of the densification process is detected by it becoming impossible to control the variation in the measured content by adjusting the flow rate.

7. A method according to claim 1, wherein the variation in the flow rate is stored so as to constitute a model that is reproducible during a subsequent process of densifying a load of the same type.

8. A method according to claim 7 wherein the end of the densification process is detected by it becoming impossible to control the variation in the measured content by adjusting the flow rate and that the duration of the densification process is also stored.

9. A method of controlling or modeling the process of densifying at least one porous substrate with pyrolytic carbon by chemical vapor infiltration, the process comprising: placing a load comprising one or more porous substrates to be densified in an oven; heating the substrate(s); admitting a reaction gas into the oven, the reaction gas containing at least one carbon-precursor hydrocarbon; adjusting the pressure in the oven so as to enable the gas to diffuse within the pores of the heated substrate(s) so as to form a deposit of pyrolytic carbon therein; and extracting effluent gas from the oven via an extraction pipe connected to an outlet from the oven;
the method being characterized by measuring the content in the effluent gas of at least one compound selected from allene, propine, and benzene; and, as a function of the measured content, by controlling the process by adjusting at least one parameter selected from: the flow rate of the reaction gas admitted into the oven, the flow rate of at least one component of the gas admitted into the oven, the transit time of the gas through the oven, the temperature to which the substrate(s) is/are heated, and the pressure that exists inside the oven,
wherein the selected parameter is adjusted within a predetermined range of values, and
wherein the end of the densification process is detected by it becoming impossible to control the variation in the measured content by adjusting the selected parameter.

* * * * *

UNITED STATES PATENT AND TRADEMARK OFFICE
CERTIFICATE OF CORRECTION

| | | |
|---|---|---|
| PATENT NO. | : 7,727,591 B2 | Page 1 of 1 |
| APPLICATION NO. | : 10/549444 | |
| DATED | : June 1, 2010 | |
| INVENTOR(S) | : Eric Sion et al. | |

It is certified that error appears in the above-identified patent and that said Letters Patent is hereby corrected as shown below:

Title page, (86) §371 (c)(1), (2), (4) Date: "Jun. 2, 2006" should read --Jun. 19, 2006--.

Signed and Sealed this
Twenty-first Day of June, 2011

David J. Kappos
*Director of the United States Patent and Trademark Office*